United States Patent
Na et al.

(10) Patent No.: US 8,922,024 B2
(45) Date of Patent: Dec. 30, 2014

(54) SEMICONDUCTOR PACKAGES INCLUDING MOLDING LAYERS

(71) Applicant: Samsung Electronics Co., Ltd., Suwon-si (KR)

(72) Inventors: Minok Na, Bucheon-si (KR); Okgyeong Park, Yeongdeok-gun (KR); Ji-Hyun Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/829,939

(22) Filed: Mar. 14, 2013

(65) Prior Publication Data

US 2013/0292848 A1  Nov. 7, 2013

(30) Foreign Application Priority Data

May 4, 2012 (KR) .......... 10-2012-0047504

(51) Int. Cl.
*H01L 23/522* (2006.01)
*H01L 23/36* (2006.01)
*H01L 23/498* (2006.01)
*H01L 21/56* (2006.01)
*H01L 25/10* (2006.01)
*H01L 23/31* (2006.01)

(52) U.S. Cl.
CPC .......... *H01L 23/5226* (2013.01); *H01L 23/36* (2013.01); *H01L 23/49816* (2013.01); *H01L 21/566* (2013.01); *H01L 25/105* (2013.01); *H01L 23/3185* (2013.01); *H01L 2224/16225* (2013.01); *H01L 2224/32225* (2013.01); *H01L 2224/73204* (2013.01); *H01L 2224/73253* (2013.01); *H01L 2225/1023* (2013.01); *H01L 2225/1058* (2013.01); *H01L 2225/1094* (2013.01); *H01L 2924/15311* (2013.01); *H01L 2924/15331* (2013.01); *H01L 2924/1815* (2013.01); *H01L 2924/18161* (2013.01); *H01L 21/563* (2013.01)
USPC .......... 257/774; 257/E23.01; 257/E21.502; 257/686; 257/773; 438/127

(58) Field of Classification Search
USPC .......... 257/E23.01, E21.502, 773, 686, 774; 438/127
See application file for complete search history.

(56) References Cited

U.S. PATENT DOCUMENTS

2012/0171814 A1* 7/2012 Choi et al. .......... 438/107
2012/0319286 A1* 12/2012 Yang et al. .......... 257/773

FOREIGN PATENT DOCUMENTS

| JP | 2000-141568 A | 5/2000 |
| JP | 2006-22136 A | 1/2006 |
| JP | 4151370 B2 | 7/2008 |
| JP | 4641606 B2 | 12/2010 |
| JP | 4647815 B2 | 12/2010 |
| KR | 10-2001-0044862 A | 6/2001 |
| KR | 10-2011-0076388 A | 7/2011 |
| KR | 10-1050562 B1 | 7/2011 |
| KR | 1020130085821 | 7/2013 |

* cited by examiner

*Primary Examiner* — S. V. Clark
*Assistant Examiner* — Krista Soderholm
(74) *Attorney, Agent, or Firm* — Myers Bigel Sibley & Sajovec, P.A.

(57) ABSTRACT

Semiconductor packages including molding layer and methods of fabricating the same are provided. The method may include forming a bare package including a semiconductor chip on a package substrate and forming a molding layer surrounding the semiconductor chip on the package substrate while contacting an upper surface of the molding layer with a lower surface of a release film. The lower surface of the release film and the upper surface of the molding layer comprising uneven surfaces and the molding layer may expose an upper surface of the semiconductor chip.

15 Claims, 13 Drawing Sheets

SEMICONDUCTOR PACKAGES INCLUDING MOLDING LAYERS

CROSS-REFERENCE TO RELATED APPLICATIONS

This U.S. non-provisional patent application claims priority under 35 U.S.C. §119 to Korean Patent Application No. 10-2012-0047504, filed on May 4, 2012, in the Korean Intellectual Property Office, the disclosure of which is hereby incorporated by reference in its entirety.

FIELD

The present disclosure generally relates to the field of electronics, and more particular to semiconductor devices.

BACKGROUND

The fabricating processes for semiconductor packages may include a step of forming a molding layer surrounding a semiconductor chip and during the step the molding layer contacts a release film. The release film may be detached from the semiconductor package after forming the molding layer. The semiconductor chip in the semiconductor package may be physically or electrically damaged when the release film is detached from the semiconductor package.

SUMMARY

A semiconductor package may include a semiconductor chip on a package substrate. The semiconductor package may further include a molding layer surrounding the semiconductor chip on the package substrate. Moreover, the molding layer may expose an upper surface of the semiconductor chip and an upper surface of the molding layer may include a pattern of recessed portions alternating with a pattern of protruding portions.

In various embodiments, the upper surface of the molding layer may be coplanar with the upper surface of the semiconductor chip.

According to various embodiments, the semiconductor package may also include a mold via terminal, which may be spaced apart from the semiconductor chip and connected to the package substrate.

In various embodiments, a top surface of the mold via terminal may be coplanar with or lower than the upper surface of the semiconductor chip.

According to various embodiments, the molding layer may further include a mold via hole exposing the mold via terminal.

In various embodiments, the semiconductor package may also include a mold via in the mold via hole and the mold via may be electrically connected to the mold via terminal.

According to various embodiments, the semiconductor package may further include a heat dissipating layer on the molding layer and the semiconductor chip In various embodiments, the semiconductor package may additionally include at least one internal connection terminal contacting the semiconductor chip and a first surface of the package substrate and an external connection terminal contacting a second surface of the package substrate. The second surface of the package substrate may be opposite the first surface of the package substrate A method of fabricating a semiconductor package may include forming a bare package including a semiconductor chip on a package substrate. The method of fabricating the semiconductor package may further include forming a molding layer surrounding the semiconductor chip on the package substrate while contacting an upper surface of the molding layer with a lower surface of a release film. The lower surface of the release film and the upper surface of the molding layer may include uneven surfaces and the molding layer may expose an upper surface of the semiconductor chip.

In various embodiments, the release film may include a base layer and a release layer on the base layer. The lower surface of the release film may include the release layer and the upper surface of the semiconductor chip may contact the lower surface of the release film.

According to various embodiments, the method of fabricating the semiconductor package may also include disposing the bare package in a casting mold, supplying a molding material into the casting mold and curing the molding material to form the molding layer. a first surface of the base layer may contact the casting mold.

In various embodiments, forming a bare package may include forming a mold via terminal, which may be spaced apart from the semiconductor chip and connected to the package substrate.

According to various embodiments, the method of fabricating the semiconductor package may include removing a portion of the molding layer to form a mold via hole exposing the mold via terminal.

In various embodiments, the method of fabricating the semiconductor package may additionally include forming a mold via in the mold via hole and the mold via may be electrically connected to the mold via terminal.

According to various embodiments, the method of fabricating the semiconductor package may include forming a heat dissipating layer on the molding layer and the semiconductor chip.

An integrated circuit chip package may include a substrate and an integrated circuit chip on the substrate. The integrated circuit chip may further include a mold layer surrounding the integrated circuit chip on the substrate and an upper surface of the mold layer may include a predetermined pattern of protruding portions.

In various embodiments, the upper surface of the mold layer further may include a predetermined pattern of recessed portions alternating with the predetermined pattern of protruding portions.

According to various embodiments, the integrated circuit chip package may also include a heat dissipating layer on the mold layer and a surface of the heat dissipating layer facing the upper surface of the mold layer may include a predetermined pattern of recessed portions corresponding to the predetermined pattern of protruding portions of the mold layer.

In various embodiments, the mold layer may expose an upper surface of the integrated circuit chip, which may be at an equal level with the upper surface of the mold layer.

According to various embodiments, the integrated circuit chip package may additionally include a mold via terminal connected to the substrate in the mold layer and the mold layer may expose a portion of the mold via terminal.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Figure 1A:
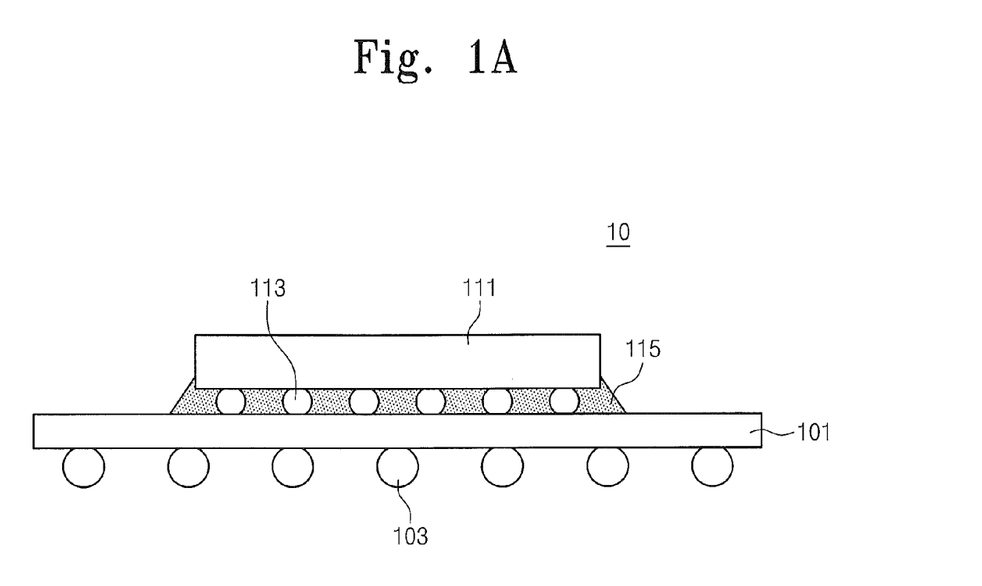
FIGS. 1A, 1B and 1E are sectional views illustrating a method of fabricating a semiconductor package according to some embodiments of the inventive concept.
Figure 1B:
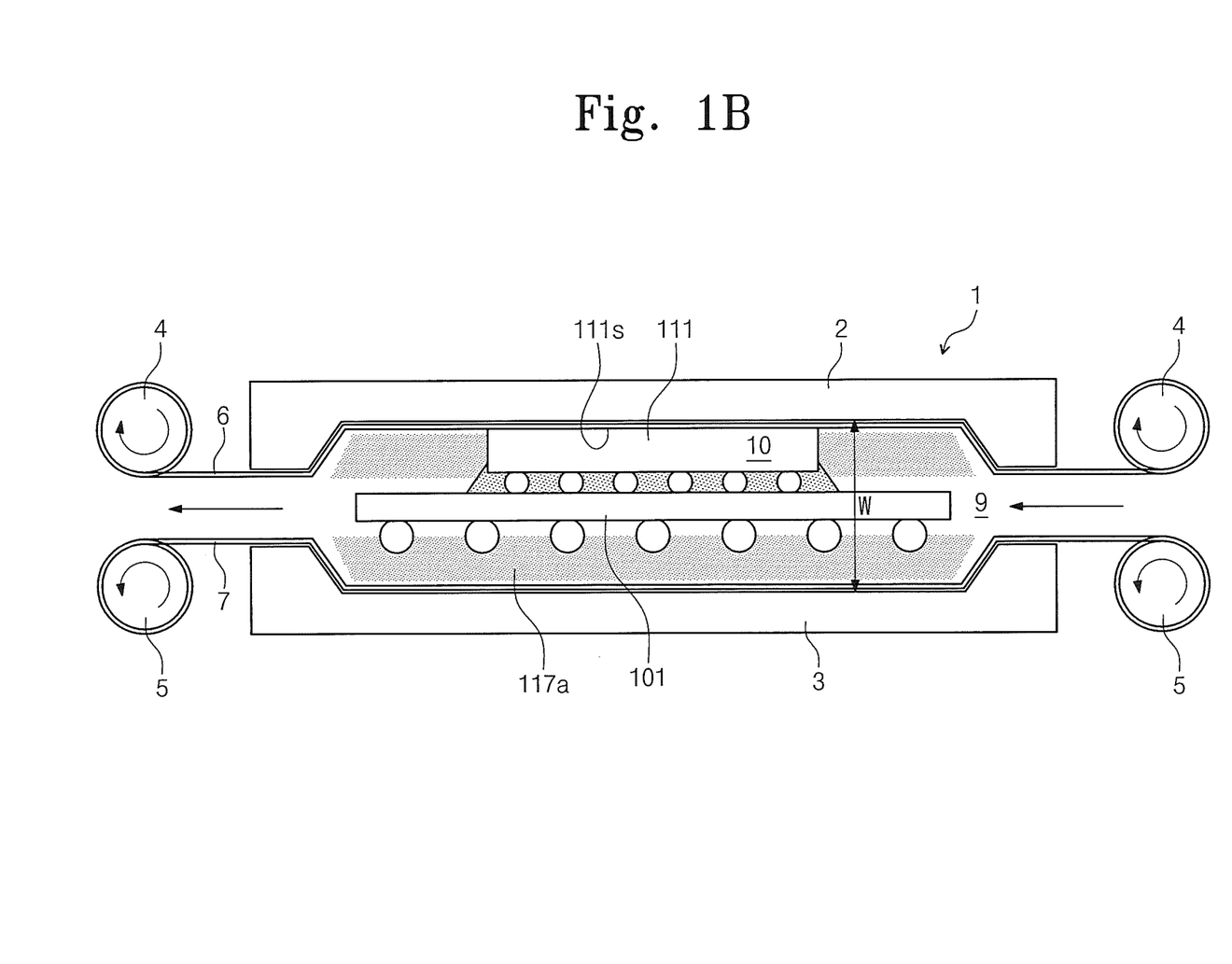
Figure 1C:
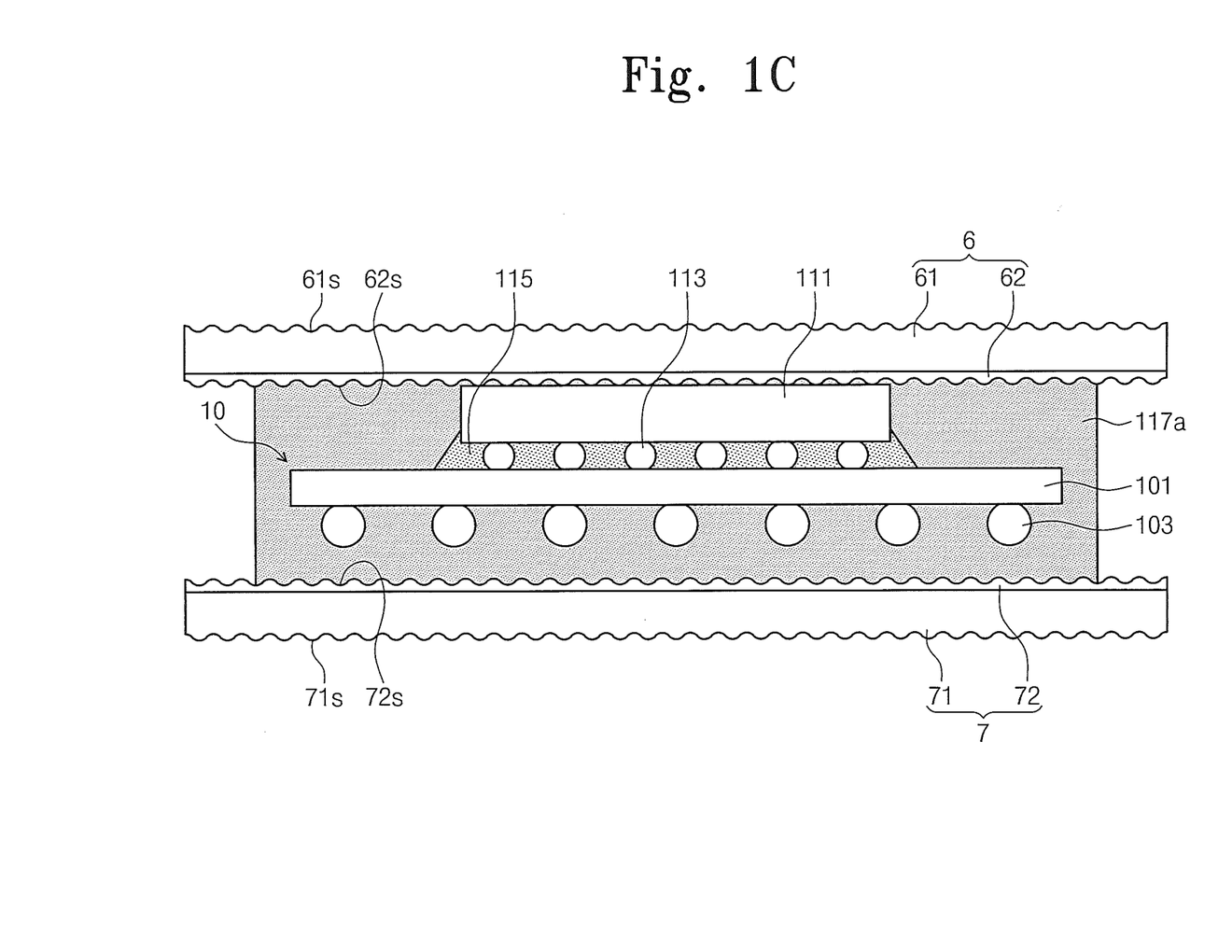
FIGS. 1C and 1D are sectional views illustrating a portion of FIG. 1B.
Figure 1D:
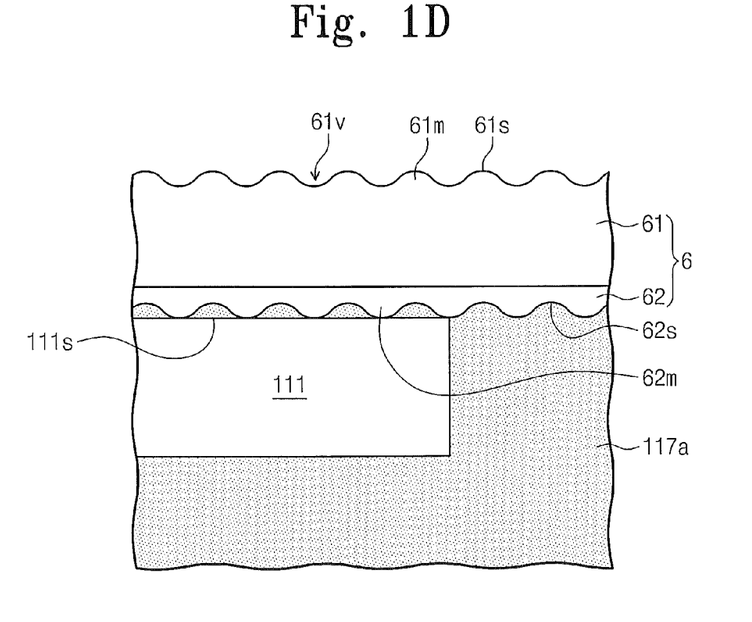
Figure 1E:
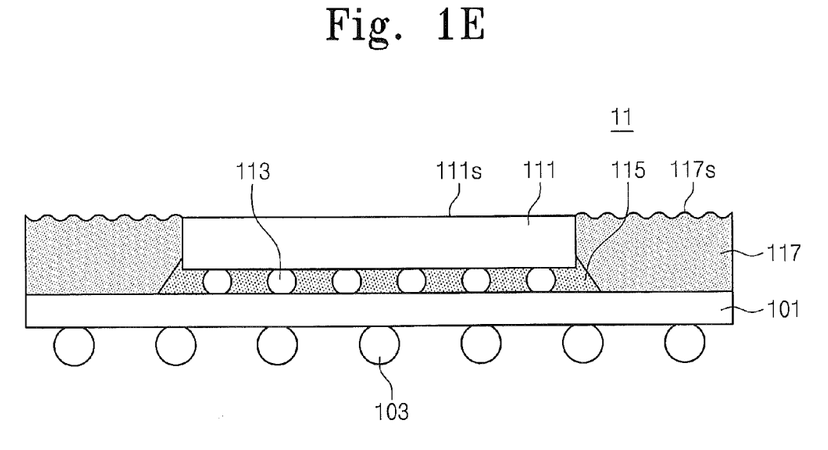
Figure 1F:
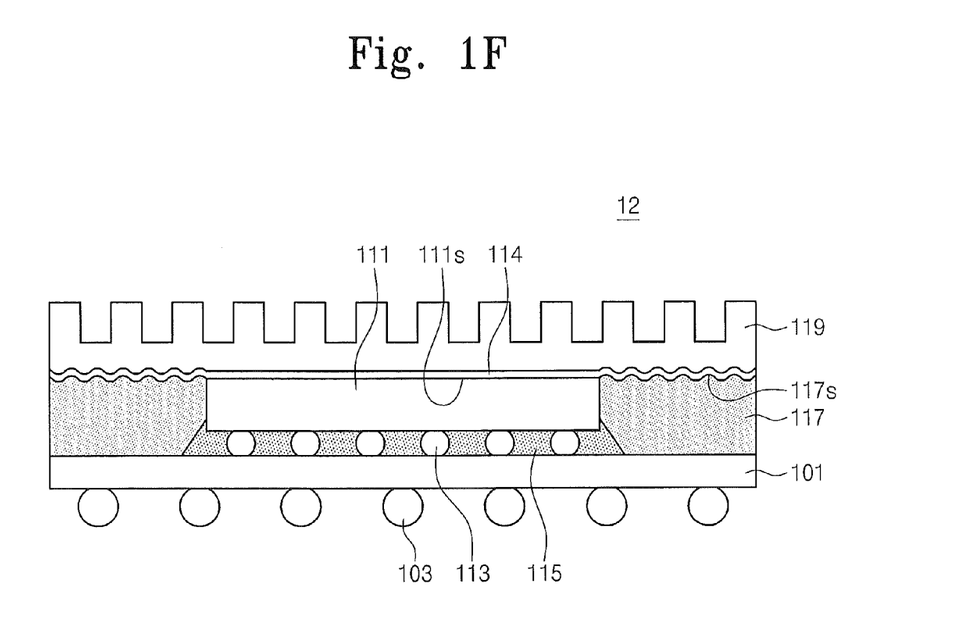
FIG. 1F is a sectional view illustrating a semiconductor package according to some embodiments of the inventive concept.

FIGS. 1A, 1B and 1E are sectional views illustrating a method of fabricating a semiconductor package according to some embodiments of the inventive concept, and FIGS. 1C and 1D are sectional views illustrating a portion of FIG. 1B. FIG. 1F is a sectional view illustrating a semiconductor package according to some embodiments of the inventive concept.

Referring to FIG. 1A, a semiconductor chip 111 may be mounted on a package substrate 101. The package substrate 101 may include a printed circuit board. The semiconductor chip 111 may be a memory chip, a logic chip, or a combination thereof. Internal connection terminals 113, such as solder balls or solder bumps, may be formed between the semiconductor chip 111 and the package substrate 101 to electrically connect the semiconductor chip 111 to the package substrate 101. External connection terminals 103 (e.g., solder balls) may be attached to the package substrate 101 to electrically connect the semiconductor chip 111 to an external device, such as a semiconductor chip, a semiconductor package, or a board of an electronic device. An under-fill layer 115 may be formed by providing an epoxy material between the semiconductor chip 111 and the package substrate 101. As the result, a bare package 10 may include the package substrate 101 and the semiconductor chip 111 mounted thereon.

Referring to FIG. 1B, a molding process may be performed. In some embodiments, the molding process may include disposing the bare package 10 into a cavity 9 of a casting mold 1, and then supplying a molding material 117a into the cavity 9. The casting mold 1 may include an upper mold 2 and a lower mold 3, which may be separated from each other. An upper release film 6 may be provided on an inside surface of the upper mold 2, and a lower release film 7 may be provided on an inside surface of the lower mold 3. The upper release film 6 may be wound around upper rollers 4 provided at both sides of the upper mold 2 and be supplied into the inside surface of the upper mold 2 by rotations of the upper rollers 4. The lower release film 7 may be wound around lower rollers 5 provided at both sides of the lower mold 3 and be supplied into the inside surface of the lower mold 3 by rotations of the lower rollers 5. In FIG. 1B, straight arrows represent a moving direction of the release films 6 and 7, and curved arrows represent rotation directions of the rollers 4 and 5.

In some embodiments, the bare package 10 may be loaded in the casting mold 1 in such a way that the package substrate 101 and the semiconductor chip 111 are disposed to face the lower mold 3 and the upper mold 2, respectively, or vice versa. In some embodiments, the molding process may be performed in the state in which a surface 111s of the semiconductor chip 111 may contact the upper release film 6. The surface 111s of the semiconductor chip 111 may be an active or inactive surface. The molding material 117a may include, for example, liquid or solid epoxy molding compound. The upper mold 2 and/or the lower mold 3 may be configured to be able to heat or melt the molding material 117a.

Referring to FIG. 1C in conjunction with FIG. 1B, the upper release film 6 may include an upper base layer 61 and an upper release layer 62, and the lower release film 7 may include a lower base layer 71 and a lower release layer 72. The upper base layer 61 and the lower base layer 71 may include one of polyester or polyimide polymers. The upper release layer 62 and the lower release layer 72 may include silicone and/or fluorine. An inside surface 62s of the upper release film 6 (also referred to as a surface 62s of the upper release layer 62) may have an uneven or rough surface, which may include a pattern of recessed portions alternating with a pattern of protruding portions. The inside surface 62s of the upper release film 6 may contact the semiconductor chip 111 of the bare package 10. An outside surface 61s of the upper release film 6 (also referred to as a surface 61s of the upper base layer 61), an inside surface 72s of the lower release film 7 (also referred to as a surface 72s of the lower release layer 72) may be uneven or rough. The inside surface 72s of the lower release film 7 may face the package substrate 101 of the bare package 10. An outside surface 71s of the lower release film 7 (also referred to as a surface 71s of the lower base layer 71) may be uneven. According to some embodiments, one of the surface 61s of the upper base layer 61 and the surface 71s of the lower base layer 71 may not have any a pattern of recessed portions or a pattern of protruding portions.

As appreciated by the present inventors, during the molding process, a low molecular weight constituent (e.g., oligomer) of the upper base layer 61 may be heated to flow out from the upper base layer 61, thereby being accumulated on the inside surface of the upper mold 2. Similarly, the low molecular weight constituent of the upper base layer 61 flowing out from the lower base layer 71 may be accumulated on the inside surface of the lower mold 3. This may lead to a decrease in an interval W between the upper and lower molds 2 and 3, and thus a stress may be exerted on the bare package 10. The stress may cause a crack in the bare package 10. The stress may deteriorate connection reliabilities of the internal connection terminals 113 and/or the external connection terminals 103. In addition, the semiconductor chip 111 may be damaged mechanically or electrically (e.g., an electrostatic damage) when the release films 6 and 7 are detached after the molding process. For example, in the case where the surface 111s of the semiconductor chip 111 is an active surface and it contacts the upper release layer 62, the physical or electrical damage may result in failures in electric characteristics of the semiconductor chip 111.

Referring to FIG. 1D in conjunction with FIG. 1B, the upper base layer 61 may have the uneven surface 61s, which may include a pattern of recessed portions alternating with a pattern of protruding portions. The uneven surface 61s may include mountain-shaped portions 61m and valley-shaped portions 61v therebetween. The low molecular weight constituent of the upper base layer 61 flowing out from the upper base layer 61 may be gathered in the valley-shaped portions 61v. Similar phenomenon may happen in the lower base layer 71. Accordingly, decrease in the interval W between the upper and lower molds 2 and 3, which may result from the accumulation of the low molecular weight constituent of the upper base layer 61, may be reduced.

In addition, the uneven surface 62s of the upper release layer 62 may reduce a contact area between the upper release layer 62 and the semiconductor chip 111 and it may reduce physical or electrical damages on the semiconductor chip 111 during detaching the upper release film 6 from the semiconductor chip 111.

Further, the mountain-shaped portions 61m of the uneven inside surface 62s may serve as a barrier preventing the molding material 117a from flowing into a space between the semiconductor chip 111 and the upper release layer 62. As appreciated by the present inventors, if the molding material 117a flows into the space between the semiconductor chip 111 and the upper release layer 62, the molding layer may be formed to have an unintended profile or increase a total height of the semiconductor package.

Dimensions and patterns of the mountain-shaped portions 61m and the valley-shaped portions 61v may be determined to achieve intended effects explained above. Patterns of the mountain-shaped portions 61m and the valley-shaped portions 61v may be periodic or aperiodic. For example, a number of the valley-shaped portions 61v or depth of valley-shaped portions 61v may be predetermined to provide a pattern so as to hold enough amount of the low molecular weight constituent of the upper base layer 61 to reduce the decrease in the interval W between the upper and lower molds 2 and 3.

Referring to FIG. 1E, the molding material 117a may be cured to form a molding layer 117. Accordingly, a semiconductor package 11 may be fabricated to include the package substrate 101 and the semiconductor chip 111 mounted thereon and surrounded by the molding layer 117. In some embodiments, as shown in FIG. 1C, the molding layer 117 may encapsulate the semiconductor package 11. In this case, the molding layer 117 may be selectively removed to expose the surface 111s of the semiconductor chip 111 and the total height of the semiconductor package 11 may be reduced compared with the structure, in which the surface 111s of the semiconductor chip 111 is covered with the molding layer 117. The molding layer 117 may include an uneven surface 117s, whose surface profile is similar to the surface 62s of the upper release layer 62. In some embodiments, the surface 117s of the molding layer 117 may be formed at a level equivalent or similar to the surface 111s of the semiconductor chip 111.

Referring to FIG. 1F, a semiconductor package 12 may be fabricated to include a heat dissipating layer 119. For example, the heat dissipating layer 119 may be formed on or attached to the surface 111s of the semiconductor chip 111 and the surface 117s of the molding layer 117. The heat dissipating layer 119 may be formed of a material having high thermal conductivity (e.g., metal). According to some embodiments of the inventive concept, since the molding layer 117 has the uneven surface 117s, the molding layer 117 can be in contact with the heat dissipating layer 119 with an increased contact area, compared with the case that the surface 117s has no recessed portions or protruding portions. Accordingly, the heat dissipating layer 119 and the molding layer 117 may be more robustly attached to each other, and furthermore, it may be possible to improve a heat dissipating property therebetween. In some embodiments, a layer 114 of thermal interface material (e.g., a thermally conductive paste) may be further provided below the heat dissipating layer 119.

Figure 2A:
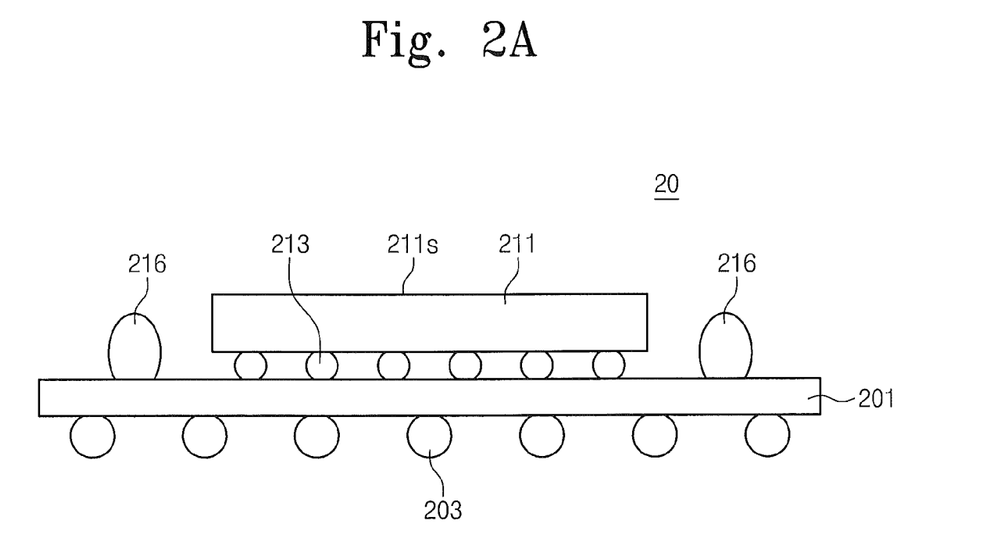
FIGS. 2A through 2D are sectional views illustrating a method of fabricating a semiconductor package according to some embodiments of the inventive concept.
Figure 2B:
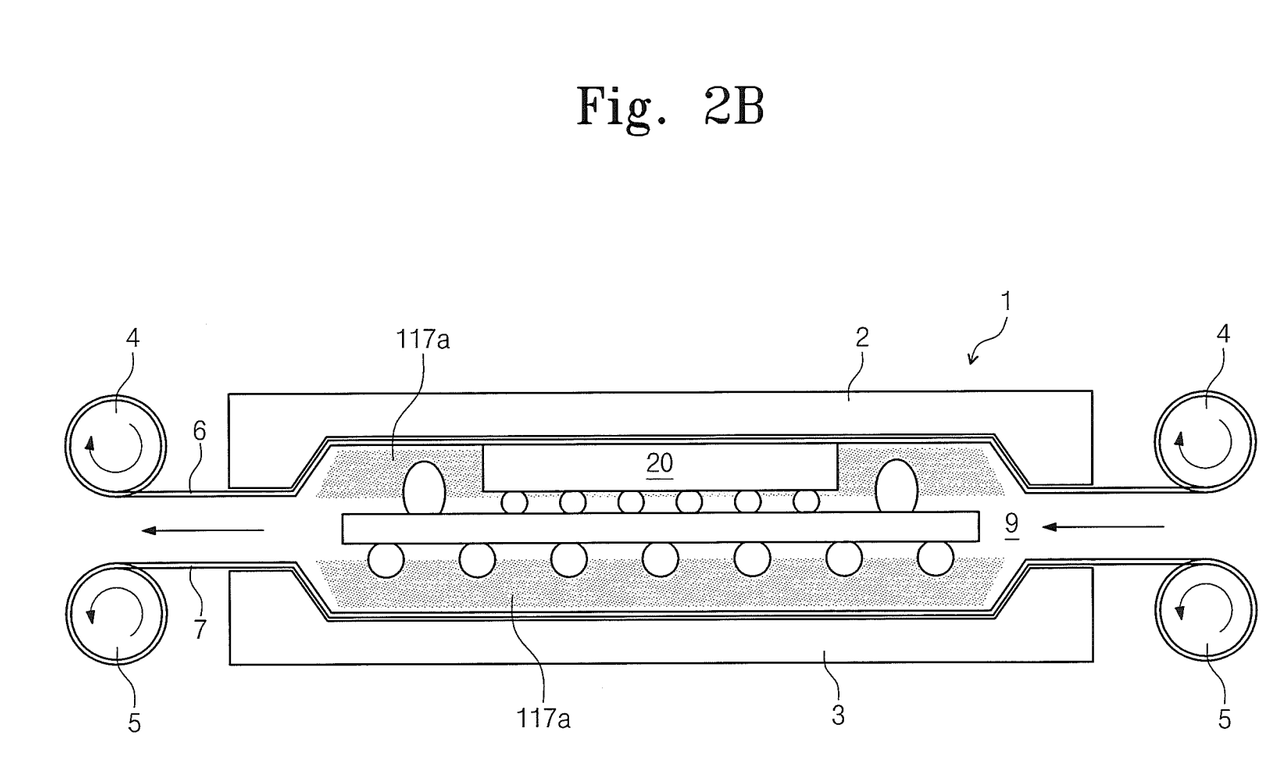
Figure 2C:
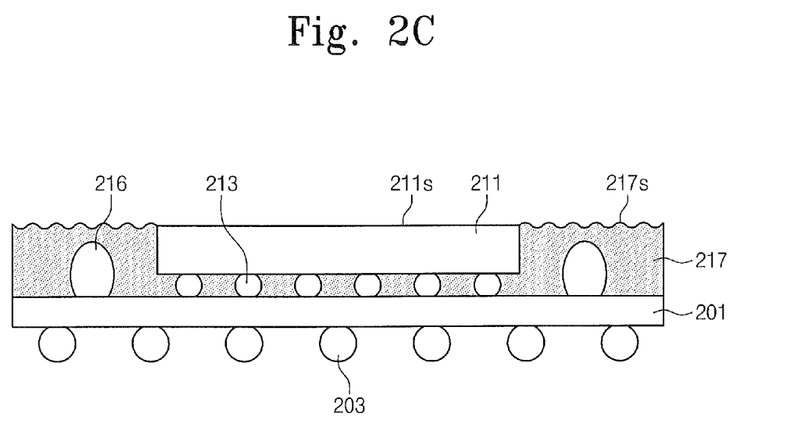
Figure 2D:
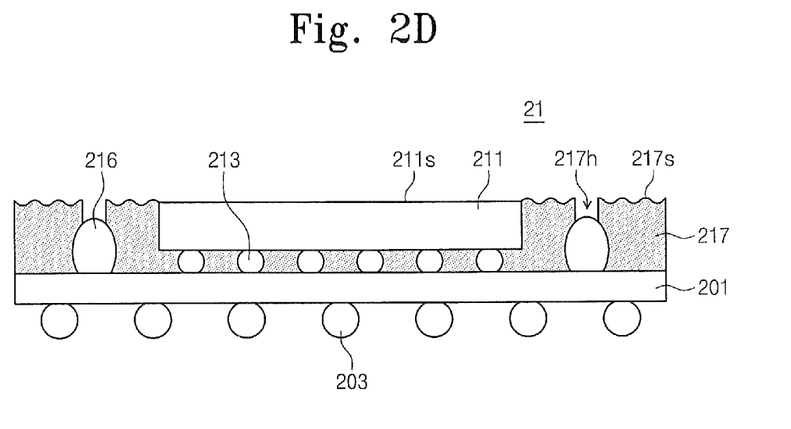
Figure 2E:
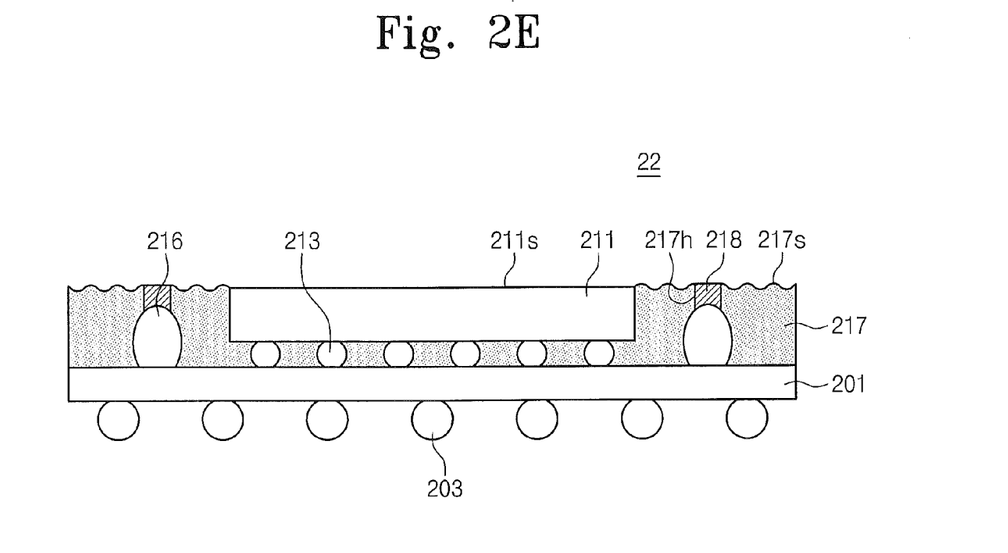
FIG. 2E is a sectional view illustrating a semiconductor package according to some embodiments of the inventive concept.

FIGS. 2A through 2D are sectional views illustrating a method of fabricating a semiconductor package according to some embodiments of the inventive concept and FIG. 2E is a sectional view illustrating a semiconductor package according to some embodiments of the inventive concept.

Referring to FIG. 2A, a semiconductor chip 211 may be mounted on a package substrate 201 (e.g., a printed circuit board), and the package substrate 201 and the semiconductor chip 211 may be electrically connected to each other using internal connection terminals 213, such as solder balls or solder bumps. Mold via terminals 216 may be formed on a surface of the package substrate 201 provided with the semiconductor chip 211. The mold via terminals 216 may be solder balls or solder bumps, which may have top surfaces located at a level lower than a surface 211s of the semiconductor chip 211. The mold via terminals 216 may be provided around or spaced apart from one of side surfaces of the semiconductor chip 211. The mold via terminals 216 may be provided at four side or opposite two side surfaces of the semiconductor chip 211. External connection terminals 203 (e.g., solder balls) may be further attached to the package substrate 201. As the result, a bare package 20 may include the semiconductor chip 211 and the mold via terminals 216 mounted on the package substrate 201. In some embodiments, the formation of the bare package 20 may further include forming an under-fill layer between the semiconductor chip 211 and the package substrate 201, as illustrated in FIG. 1A. Meanwhile, the presence of the mold via terminals 216 may result in a difficulty in supplying an under-fill material into a space between the semiconductor chip 211 and the package substrate 201, and thus, it may be hard to form the under-fill layer. In this case, a mold under-fill process may be performed, as will be described below.

Referring to FIG. 2B, a molding process may be performed. In some embodiments, the molding process may include disposing the bare package 20 into a cavity 9 of a casting mold 1 and then supplying a molding material 117a into the cavity 9. For example, the molding process according to some embodiments may be performed using processes similar to the processes described with reference to FIGS. 1B through 1D.

Referring to FIG. 2C, as the result of the molding process, a molding layer 217 may be formed to expose the surface 211s of the semiconductor chip 211 and have an uneven surface 217s. Where the under-fill layer is not formed between the semiconductor chip 211 and the package substrate 201, the molding layer 217 may serve as the under-fill layer. The molding process according to the present embodiment may be a mold under-fill (MUF) process of forming the molding layer 217 and the under-fill layer at the same time.

Referring to FIG. 2D, the molding layer 217 may be patterned to form mold via holes 217h exposing the mold via terminals 216. In some embodiments, the mold via hole 217h may be formed by, for example, a laser irradiating process, an etching process, or a mechanical drilling process. The mold via terminals 216 may be formed to have top surfaces lower than or coplanar with the surface 217s of the molding layer 217. As the result of the series of the processes, a semiconductor package 21 may be fabricated to include the semiconductor chip 211 and the mold via terminals 216 that are mounted on the package substrate 201. In some embodiments, the semiconductor package 21 may be electrically connected to other semiconductor device or package having connection terminals, which may be provided in the mold via holes 217h to be in contact with the mold via terminals 216.

Referring to FIG. 2E, a conductive material may be formed to form mold vias 218 filling the mold via holes 217h. A semiconductor package 22 according to some embodiments may further include the mold vias 218, which may be in contact with the mold via terminals 216 and be electrically connected to the package substrate 201. The mold vias 218 may be formed using an electroplating process or a deposition process to fill the mold via holes 217h. In some embodiments, the mold vias 218 may have top surfaces coplanar with the surface 217s of the molding layer 217. In some embodiments, the mold vias 218 may protrude upward or be recessed from the surface 217s of the molding layer 217. As the result of the series of the processes, the semiconductor package 22 may be fabricated to include the semiconductor chip 211 and the mold via terminals 216 that are mounted on the package substrate 201. In some embodiments, the semiconductor package 22 may be electrically connected to an external device, such as other semiconductor device or package, via the mold vias 218 and/or the external connection terminals 203.

Figure 3A:
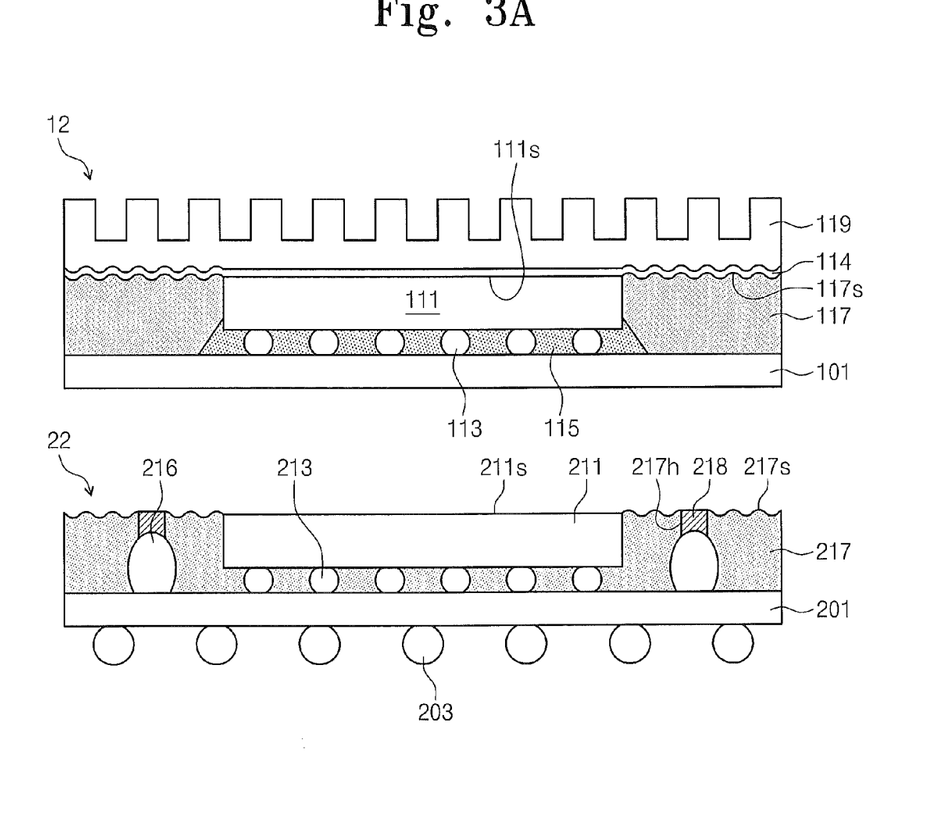
FIGS. 3A and 3B are sectional views illustrating a method of fabricating a semiconductor package according to some embodiments of the inventive concept.
Figure 3B:
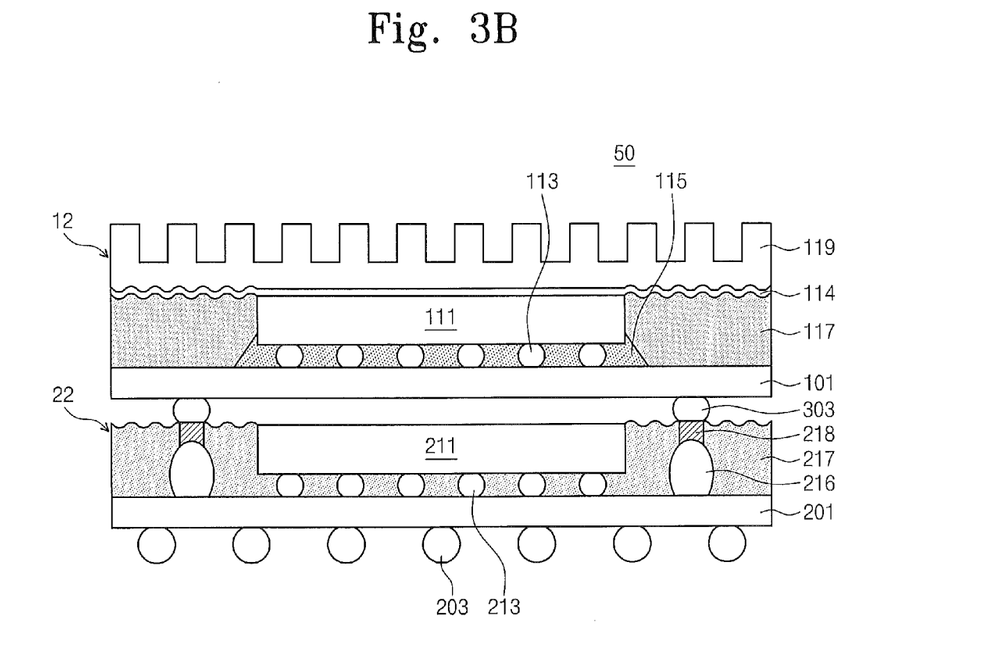

FIGS. 3A and 3B are sectional views illustrating a method of fabricating a semiconductor package according to some embodiments of the inventive concept.

Referring to FIG. 3A, the semiconductor package 12 (hereinafter, referred as to a first semiconductor package) and the semiconductor package 22 (hereinafter, referred as to a second semiconductor package) may be provided. The first semiconductor package 12 may be fabricated using processes similar to the processes described with reference to FIGS. 1A, 1B, 1E and 1F, and the second semiconductor package 22 may be fabricated using the same process as that described with reference to FIGS. 2A through 2E. According to some embodiments, in the first semiconductor package 12, external connection terminals may not be attached to a bottom surface of the package substrate 101.

Referring to FIG. 3B, the first semiconductor package 12 may be stacked on the second semiconductor package 22, and package connection terminals 303 may be disposed between the first semiconductor package 12 and the second semiconductor package 22. Each of the package connection terminals 303 may be connected to the corresponding one of the mold vias 218 to electrically connect the first semiconductor package 12 to the package substrate 101. In some embodiments, the first semiconductor package 12 may be fabricated to include the package connection terminals 303 attached to the bottom surface of the package substrate 101, and then the first semiconductor package 12 provided with the package connection terminals 303 may be stacked on the first semiconductor package 22. In some embodiments, the second semiconductor package 22 may be fabricated to include the package connection terminals 303 connected to the mold vias 218, respectively, and then the first semiconductor package 12 may be stacked on the second semiconductor package 22 provided with the package connection terminals 303. As the result of the series of the processes, a package-on-package type semiconductor package 50 may be fabricated to include the first semiconductor package 12 stacked on the second semiconductor package 22 and the package connection terminals 303 electrically connecting the first and second semiconductor packages 12 and 22.

Figure 4A:
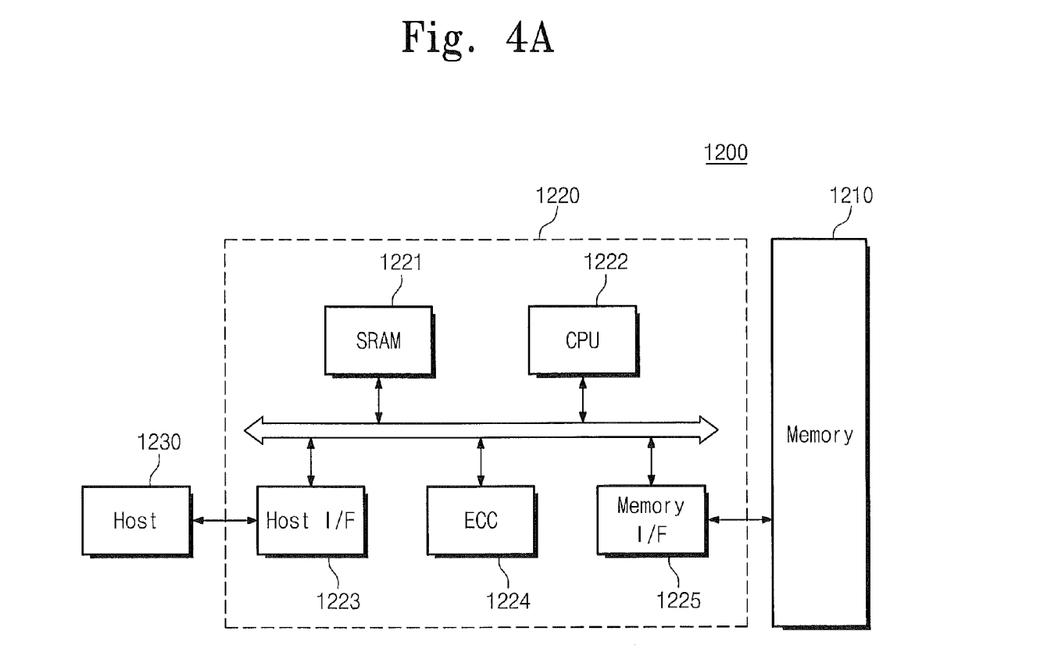
FIG. 4A is a block diagram of a memory card including the semiconductor package according to some embodiments of the inventive concept.
Figure 4B:
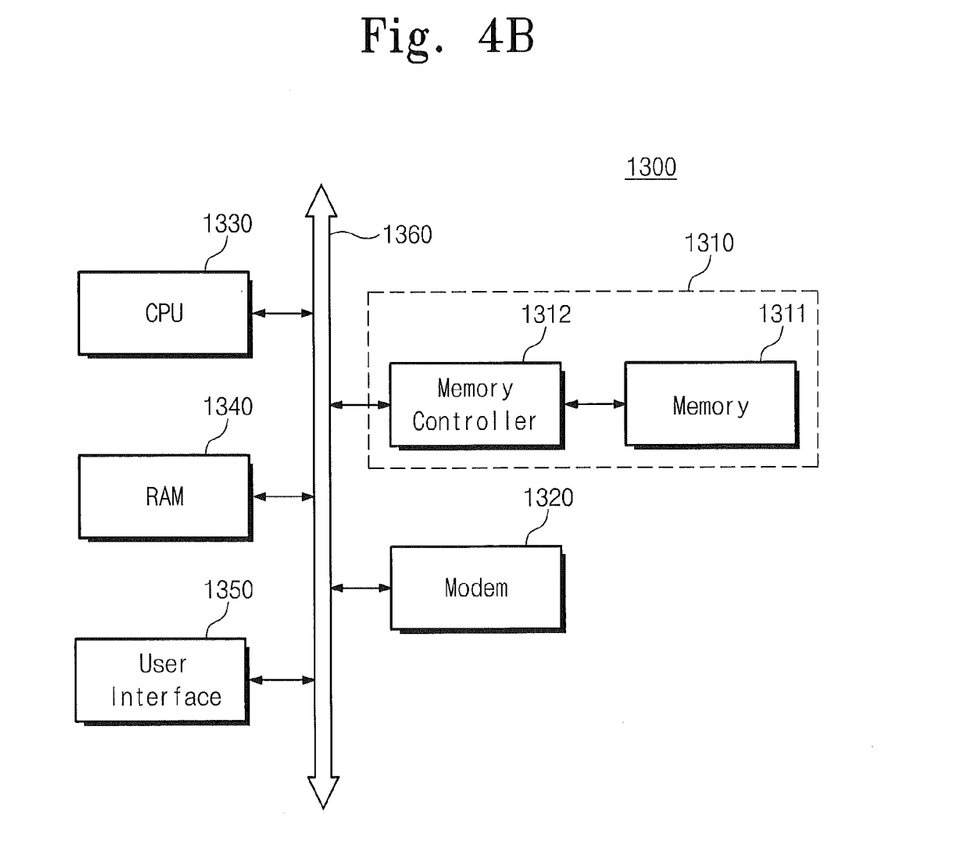
FIG. 4B is a block diagram of an information processing system including the semiconductor package according to some embodiments of the inventive concept.

FIG. 4A is a block diagram of a memory card including the semiconductor package according to some embodiments of the inventive concept and FIG. 4B is a block diagram of an information processing system including the semiconductor package according to some embodiments of the inventive concept.

Referring to FIG. 4A, a memory card 1200 may include a memory controller 1220 controlling general data exchanges between a host and a memory device 1210. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. A processing unit 1222 may perform general control operations for data exchange of the memory controller 1220. The memory device 1210 may include a semiconductor packages according to some embodiments of the inventive concept.

Referring to FIG. 4B, information processing system 1300 may be realized using a memory system 1310 including a semiconductor packages according to some embodiments of the inventive concept. The information processing system 1300 may be, for example, a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured to be identical to the memory card 1200 described with respect to FIG. 4A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. It is apparent to those skilled in the art that, the information processing system 1300 according to the inventive concept may further include, for example, an application chipset, a camera image sensor, a camera image signal processor (ISP), an input/output device.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package comprising,
a semiconductor chip on a package substrate; and
a molding layer surrounding the semiconductor chip on the package substrate,
wherein the molding layer exposes an upper surface of the semiconductor chip,
wherein an upper surface of the molding layer comprises a pattern of recessed portions alternating with a pattern of protruding portions, and
wherein lowermost points of the recessed portions are at a first height that is substantially equivalent to a second height of the upper surface of the semiconductor chip.

2. The semiconductor package of claim 1, further comprising a mold via terminal in the molding layer, and wherein the mold via terminal is spaced apart from the semiconductor chip and connected to the package substrate.

3. The semiconductor package of claim 2, wherein a top surface of the mold via terminal is coplanar with or lower than the upper surface of the semiconductor chip.

4. The semiconductor package of claim 2, wherein the molding layer includes a mold via hole exposing the mold via terminal.

5. The semiconductor package of claim 4, further comprising a mold via in the mold via hole, and wherein the mold via is electrically connected to the mold via terminal.

6. The semiconductor package of claim 1, further comprising a heat dissipating layer on the molding layer and the semiconductor chip.

7. The semiconductor package of claim 1, further comprising at least one internal connection terminal contacting the semiconductor chip and a first surface of the package substrate and an external connection terminal contacting a second surface of the package substrate, and wherein the second surface of the package substrate is opposite the first surface of the package substrate.

8. An integrated circuit chip package, comprising:
an integrated circuit chip on a substrate; and
a mold layer surrounding the integrated circuit chip on the substrate,
wherein an upper surface of the mold layer comprises a predetermined pattern of protruding portions,
wherein the mold layer exposes an upper surface of the integrated circuit chip, and
wherein uppermost points of the protruding portions are at a first height that is higher than a second height of the upper surface of the integrated circuit chip.

9. The integrated circuit chip package of claim 8, wherein the upper surface of the mold layer further comprises a predetermined pattern of recessed portions alternating with the predetermined pattern of the protruding portions.

10. The integrated circuit chip package of claim 8, further comprising a heat dissipating layer on the mold layer, wherein a surface of the heat dissipating layer facing the upper surface of the mold layer comprises a predetermined pattern of recessed portions corresponding to the predetermined pattern of the protruding portions of the mold layer.

11. The integrated circuit chip package of claim 8, further comprising a mold via terminal connected to the substrate in the mold layer, wherein the mold layer exposes a portion of the mold via terminal.

12. The semiconductor package of claim 1, wherein uppermost points of the protruding portions are at a third height that is higher than the second height of the upper surface of the semiconductor chip.

13. The semiconductor package of claim 1, wherein the recessed portions and the protruding portions are continuous with each other.

14. The integrated circuit chip package of claim 9, wherein lowermost points of the recessed portions are at a third height that is substantially equivalent to the second height of the upper surface of the integrated circuit chip.

15. The integrated circuit chip package of claim 9, wherein the recessed portions and the protruding portions are continuous with each other.

* * * * *